United States Patent
Shand

(10) Patent No.: US 6,192,447 B1
(45) Date of Patent: Feb. 20, 2001

(54) METHOD AND APPARATUS FOR RESETTING A RANDOM ACCESS MEMORY

(75) Inventor: Mark A. Shand, Dampierre-en-Yvelines (FR)

(73) Assignee: Compaq Computer Corporation, Houston, TX (US)

(*) Notice: Under 35 U.S.C. 154(b), the term of this patent shall be extended for 0 days.

(21) Appl. No.: 09/058,001

(22) Filed: Apr. 9, 1998

(51) Int. Cl.⁷ ........................................................ G06F 12/00
(52) U.S. Cl. ............................ 711/111; 711/154; 711/166; 710/13; 713/100
(58) Field of Search ............................ 711/111, 166, 711/156; 365/185.04, 185.11; 710/13; 713/100

(56) References Cited

U.S. PATENT DOCUMENTS

| | | | |
|---|---|---|---|
| 4,638,454 | * 1/1987 | Waterworth | 711/166 |
| 5,230,058 | * 7/1993 | Kumar et al. | 710/13 |
| 5,257,380 | * 10/1993 | Lang | 711/166 |
| 5,432,918 | * 7/1995 | Stamm | 711/156 |
| 5,794,033 | * 8/1998 | Aldebert et al. | 713/100 |

* cited by examiner

Primary Examiner—Do Hyun Yoo
Assistant Examiner—Nasser Moazzami
(74) Attorney, Agent, or Firm—Oppenheimer Wolff & Donnelly LLP

(57) ABSTRACT

A resettable memory apparatus includes a random access memory including a plurality of memory locations, each memory location stores a plurality of bits of data. A single register has a plurality of bits, there is one bit for each of the plurality of memory locations. A reset signal resets all of the bits in the register to invalid. A reset value is generated when reading a particular one of the memory locations while the corresponding bit in the register is invalid to provide a resettable random access memory. Writing data to the particular memory location sets the corresponding bit in the register to valid. Subsequent reads to the location while produced the data stored therein as long as the corresponding bit in the register remains valid.

29 Claims, 3 Drawing Sheets

METHOD AND APPARATUS FOR RESETTING A RANDOM ACCESS MEMORY

FIELD OF THE INVENTION

This invention relates to memories, and more particularly to resettable memories.

BACKGROUND OF THE INVENTION

In some digital devices, a set of registers is used to store values that determine how the device is configured, and how the device should operate. For example, a PCI bus interface uses resettable configuration space registers. From time to time it is necessary to reset the registers to a known "reset" value, for example, at cold start, or after a failure.

Typically, resettable registers operate as follows. Initially, the registers store the known reset value. During operation, other values can be written to the registers. After a reset, a read access to a particular register should produce the reset value, until the register has been written. After valid data has been written to a register, the registers can be read. In most cases, the reset is performed to all registers in a single time unit, for example, one cycle of the system clock.

Prior art approaches use resettable registers directly. A reset capability adds to the amount of circuitry required to implement a storage location. In some implementation technologies, particularly those relying on a restricted set of pre-diffused circuit structures, for example mask or field programmed gate arrays, (FPGA), the number of additional circuit elements needed to provide a reset capability can be substantial.

Therefore, there is a need for memories that can be reset to produce known values after a reset without substantially increasing the number of circuit elements.

SUMMARY OF THE INVENTION

The invention provides a resettable memory with a small number of additional circuit elements. A random access memory includes a plurality of memory locations, each memory location storing a plurality of bits. The number of locations and the number of bits stored in each location can be adjusted to the type and number of resettable registers that are required.

A separate single resettable register is associated with a plurality of bits, there is one bit for each of the plurality of memory locations. The resettable register can be cleared during a single clock cycle by a reset signal. Resetting the registers zeroes all bits, for example, making all corresponding memory locations invalid. A particular bit in the register is set to one by a write to the corresponding memory location. The memory location is now valid.

When reading a particular memory location while the corresponding bit in the register is invalid generates a reset value. The reset value can either be produced from a gated reset value register, or from one of the memory locations. In the first case, two gates are used to select data output either from the random access memory, or the reset value register depending on the state of the corresponding bit in the register. In the second case, the memory access address is recoded to a memory location that stores the reset value.

In one aspect of the invention, a read-only memory can be connected to the read/write signal inputs of the random access memory to provide fine-grained read-only and read/write access to the random access memory locations.

DETAILED DESCRIPTION OF THE PREFERRED EMBODIMENTS

Figure 1:
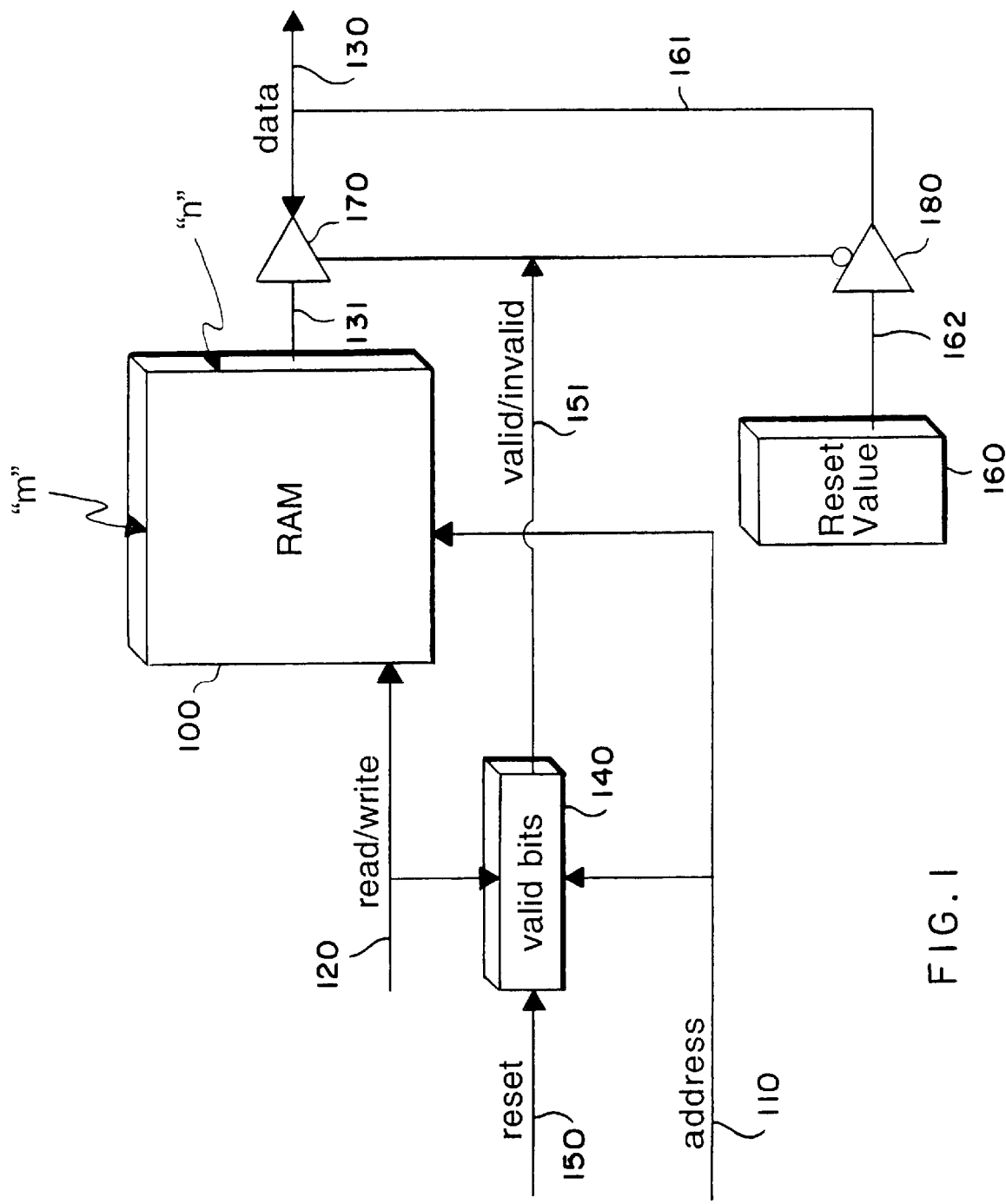
FIG. 1 is a circuit diagram for producing known values from a memory after a reset according to the invention.

FIG. 1 shows a random access memory (RAM) 100. The additional circuit elements shown in FIG. 1 allow the memory to produce known values for read accesses after a reset signal, until memory locations have been written. The RAM 100 includes "m" addressable locations, each location includes "n" bits of storage. The size of the RAM 100 (m by n) can be adjusted to provide however many "resettable registers" are required.

Conventional RAM includes a set of addressable locations, only one of which may be read or modified in each time period. This makes impossible to use a RAM by itself as a set of resettable registers. A reset capability requires that several or all locations be modified simultaneously to a designated reset value in a single time period. The behavior of a particular location in a set of registers with a reset capability differs from that of a location in a conventional RAM in its response to reads in the period between receipt of the reset signal and the first subsequent write to a location.

During operation of the RAM 100, addresses are signaled on line 110. The mode of access, read or write, is signaled on line 120. Data at the signaled address are read and written via line 130.

The reset capability according to the invention is provided, in part, by a single resettable register 140. The register 140 has one bit for each of the "m" locations of the memory 100. These "m" bits are called "valid" or "invalid" bits, depending on their states. The bits of the register are accessed by the address signals on line 110. The access mode is controlled by line 120.

The register 140 is reset by a signal on line 150. The reset signal clears all of the bits in a single clock cycle, e.g., the bits are all set to a logical zero. When a particular bit is zero, the corresponding location of the RAM 100 is said to be "invalid."

A write to a particular memory location will set the corresponding bit of register 140 to, for example, a logical one, and the corresponding memory location after the write is now valid. Note, the valid and invalid indication (0/1) in the reset register could be reversed, this is an implementation detail. Also note, that the invention directly uses only "m" resettable register bits, instead of "m" times "n" resettable register bits as in the prior art to greatly reduce the number of circuit elements required.

In one implementation of the invention, an additional register 160 is provided to store a "reset value." Gating circuit elements 170 and 180 determine whether data are read from an accessed memory location, or from the reset value register 160 as follows.

In response to a write access to a particular memory location, the corresponding bit in the reset register 140 is set valid. A valid signal on line 151 opens gate 170, and closes gate 180. If a read access is made to a particular memory location while the corresponding bit in register 140 is invalid, the invalid signal on line 151 will close gate 170, and open gate 180 so that the reset value from register 140 is produced on line 130 via lines 162 and 161, instead of the actual data stored at the addresses memory location. Note, this circuitry does not require a time-consuming resetting of any of the memory locations, only the bits in register 140 need to be reset. Data in the memory locations are only modified during write accesses.

Figure 2:
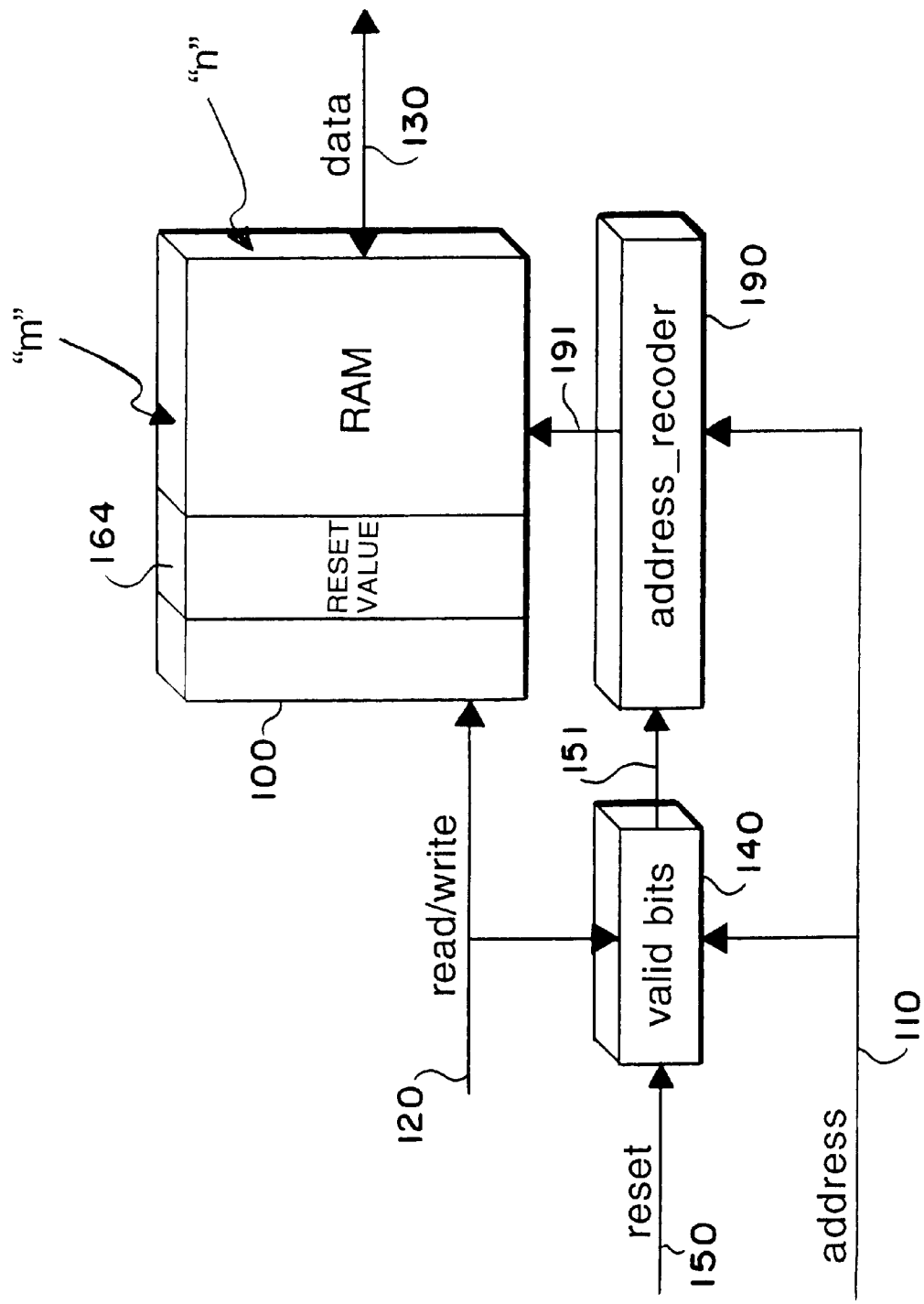
FIG. 2 is a circuit diagram of an alternative embodiment of the invention.

FIG. 2 shows an alternative embodiment. Here, an address-recoder 190 is used. The bits in register 140 are set and reset as described above. In this case, an invalid bit on line 151 causes the address-recoder to change the address during a read access to be modified to a known "reset value" location 164 of the RAM 100. This location 164 stores the same reset value as would register 160 described above.

In the present invention, all RAM block locations retain their prior value after receipt of the reset signal. An invalid bit, i.e., while the bit is in the cleared state, causes reads to return the reset value. As each RAM location is written, its corresponding bit is set to valid causing the RAM to revert to normal RAM behavior while simultaneously receiving a new value which supersedes the reset value. The RAM block and controlling valid/invalid bits as described above exhibits the behavior of a set of registers with a reset capability.

Figure 3:
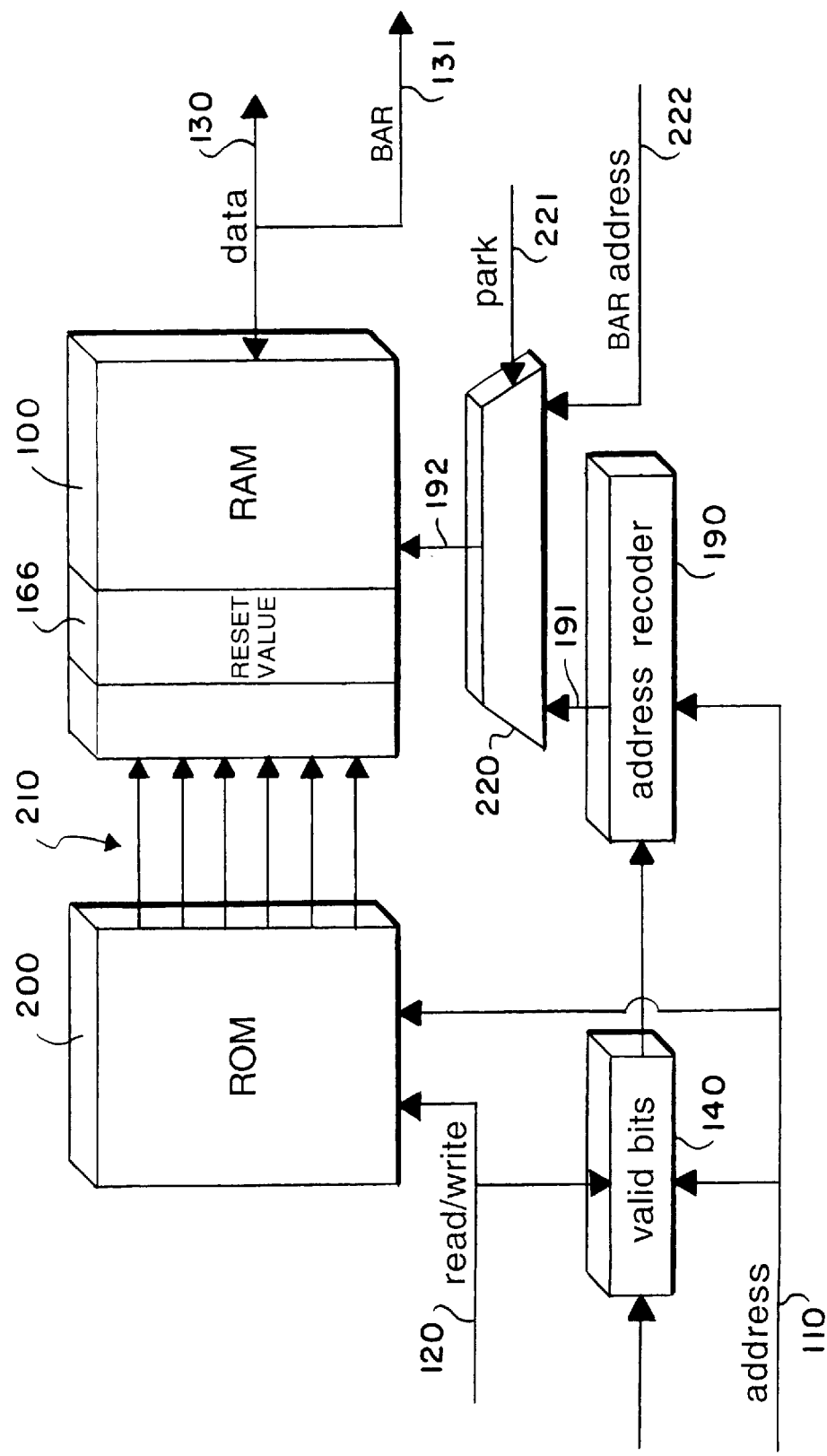
FIG. 3 is a circuit diagram of a memory with fine-grained read-write/read-only capability.

As shown in FIG. 3, two additional circuit elements are required for a specific application of the invention, for example, to provide resettable configuration space registers for a PCI bus interface.

PCI configuration space register mix read-only and read-write bits within one addressable memory location. To facilitate this operation, a read-only memory 200 is provided. The ROM 200 has m by n read-only bits corresponding to each read-write bit in RAM 100. The ROM 200 is coupled to the RAM 100 by lines 210.

In this variation of the circuit shown in FIG. 2, the ROM 200 receives the read/write signal on line 120. The ROM 200 also receives the address on line 110. An access to the RAM 100 at a particular addressable location will read the ROM 200 at the corresponding location to provided read-write output signal on a corresponding one of the lines 210. The output will control how each bit in the particular RAM location is accessed at a fine-grained level, read-only, or read-write.

In addition, the contents of some configuration space registers must be available to the rest of the PCI interface circuit. Notably the value of a Base Address Registers (BAR) must be compared to incoming addresses at the start of each PCI transaction. When only one BAR is required, access is achieved by parking the input address of the RAM block which implements the configuration space registers on the register holding the BAR.

This is accomplished by the addition of a multiplexer 220. The muliplexer 220 has two inputs, the access address (actual or recoded) on line 191, and the value stored in the BAR on line 222. The output of the multiplexer 220 is selected by the park signal on line 221. If the BAR address is selected, then the value of a location 166 is signaled on line 131 to the rest of the PCI interface circuit.

The invention allows a denser implementation when only a subset of locations require the reset capability and thus only this subset of locations require valid bits, and when the minimum write granularity to the registers comprises multiples bits of storage, then these bits can also be controlled by a single resettable bit. In this latter case a single bit controls the state of multiple RAM bits. For example, implementing the PCI bus interface using the Xilinx Corporation 4000 series FPGAs, the circuit density improvement is about sixteenfold.

It is understood that the above-described embodiments are simply illustrative of the principles of the invention. Various other modifications and changes may be made by those skilled in the art which will embody the principles of the invention and fall within the spirit and scope thereof.

I claim:

1. A resettable memory apparatus including a random access memory having a plurality of memory locations, each of the plurality of memory locations storing a plurality of bits of data, comprising:

a register having a plurality of bits, there being one bit for each of the plurality of memory locations;

means for resetting all of the bits in the register to invalid;

an address recoder for recoding an address of any of the plurality of memory locations to a reset address when accessing the address in the random access memory while a bit of the plurality of bits in the register that corresponds to the address is invalid;

a multiplexer having a first input connected to the output of the address recoder and a second input connected to a base address register, the multiplexer selecting by a park signal an input address for the random access memory and a base location of the random access memory storing a base address to read when the second input of the multiplexer is selected; and means for generating a reset value when reading a particular one of the memory locations while the corresponding bit in the register is invalid to provide a resettable random access memory.

2. The apparatus of claim 1 further comprising means for setting to valid a bit of the plurality of bits in the register while writing data to a memory location of the plurality of memory locations to which the bit corresponds.

3. The apparatus of claim 2 further comprising means for reading data from the memory location while a corresponding bit of the plurality of bits in the register is valid.

4. The apparatus of claim 1 wherein all of the bits in the register are reset in a single clock cycle.

5. The apparatus of claim 1 further comprising a reset value register storing the reset value, a first gate to control the output of the random access memory and a second gate to control the output of the reset value register, the first and second gates being controlled by the bits in the register.

6. The apparatus of claim 5 wherein the first gate is closed and the second gate is opened when reading any of the plurality of memory locations while the corresponding bit of the plurality of bits in the register is invalid.

7. The apparatus of claim 5 wherein the first gate is opened and the second gate is closed when reading any of the plurality of memory locations while a corresponding bit of the plurality of bits in the register is invalid.

8. The apparatus of claim 1 further comprising a read-only memory having one read-only location for each of the plurality of memory locations, the read-only memory producing a read-write signal on one of a plurality of lines while the random access memory is accessed.

9. The apparatus of claim 1 wherein circuit elements used to implement the apparatus are pre-diffused circuit structures.

10. The apparatus of claim 9 wherein the pre-diffused circuit structures are field programmed gate arrays.

11. A method for accessing a random access memory having a plurality of memory locations, each of the plurality of memory locations storing a plurality of bits of data, comprising:

resetting a plurality of bits in a register to invalid in response to a reset signal, there being one bit for each of the plurality of memory locations;

recoding to a reset address, in an address recoder, any address of the plurality of memory locations to which corresponds a bit of the plurality of bits in the register that is invalid when accessing the random access memory;

selecting based on a park signal, by a multiplexer having a first input connected to an output of the address recoder and a second input connected to a base address register, an input address for the random access memory and a base location of the random access memory storing a base address to read when the second input of the multiplexer is selected; and generating a reset value when reading a particular one of the memory locations while the corresponding bit in the register is invalid to provide a resettable access memory.

12. The method of claim 11 further comprising generating the reset value from a reset value register when reading one of the plurality of memory locations while a corresponding bit of the plurality of bits in the register is invalid.

13. The method of claim 11 further comprising setting a particular bit of the register to valid when writing to one of the plurality of memory locations to which the particular bit corresponds.

14. The method of claim 11 further comprising reading data from a particular one of the plurality of memory locations while the corresponding bit of the plurality of bits in the register is valid.

15. The method of claim 11 wherein all of the bits in the register are reset in a single clock cycle.

16. The method of claim 11 further comprising controlling first and second gates by the plurality of bits in the register the first gate controlling an output of the random access memory and the second gate controlling an output of the reset value register.

17. The method of claim 16 further comprising closing the first gate and opening the second gate when reading the particular one of the plurality of memory locations while the corresponding bit of the plurality of bits in the register is invalid.

18. The method of claim 16 further comprising opening the first gate and closing the second gate when reading the particular one of the plurality of memory locations while the corresponding bit of the plurality of bits in the register is invalid.

19. The method of claim 11 further comprising recoding an address of one of the plurality of memory locations to a reset address when accessing the address in the random access memory while the corresponding bit of the plurality of bits in the register is invalid, a memory location at the reset address storing the reset value.

20. The method of claim 11 wherein the plurality of memory locations are not reset upon resetting the plurality of bits in the register in response to the reset signal.

21. A resettable memory device including a random access memory having memory locations, each of the memory locations storing bits of data, comprising:

a register having bits, there being one bit in the register for each of the memory locations;

means for resetting all of the bits in the register to invalid in response to a reset signal;

an address recoder capable of recoding to a reset address a memory address of any one of the memory locations while its corresponding bit in the register is invalid, such that for a read access of the memory address the address recoder provides at its output the reset address while the corresponding bit is invalid and the memory address while the corresponding bit is valid;

means for providing a known reset value as a data output in place of data from any one of the memory locations which is being read-accessed while the corresponding bit from among the bits of the register is invalid; and a multiplexer having an output connected to the random access memory, a first input connected to the output of the address recoder and a second input connected to a base address register, based on a park signal the multiplexer selecting between the first and second inputs, such that when the first input is selected either the reset address or the memory address are selected, and such that when the second input address is selected an address of the base address register is selected wherein a resettable random access memory is provided.

22. The device of claim 21 further comprising means for setting to valid any one of the bits in the register while writing data to a corresponding one of the memory locations.

23. The device of claim 21 further comprising:

a reset value register storing the known reset value;

a first gate controlling the output of the random access memory; and a second gate controlling the output of the reset value register, the first and second gates being controlled by the plurality of bits in the register.

24. The device of claim 21 further comprising a read-only memory having one read-only location for each of the memory locations, the read-only memory producing a read-write signal on one of a plurality of lines while accessing the random access memory.

25. A method for accessing a random access memory having memory locations, each of the memory locations storing bits of data, comprising:

resetting bits in a register to invalid in response to a reset signal, there being one bit in the register for each of the memory locations;

providing a known reset value as a data output in place of data from any one of the memory locations which is being read-accessed while a corresponding bit from among the bits of the register is invalid, such that a resettable random access memory is provided;

recoding in an address recoder a particular address to a reset address when accessing the random access memory while the corresponding bit from among the bits in the register is invalid; and selecting based on a park signal, by a multiplexer having a first input connected to an output of the address recoder and a second input connected to a base address register, an input address for the random access memory and a base location of the random access memory storing a base address to read when the second input of the multiplexer is selected.

26. The method of claim 25 further comprising generating the known reset value from a reset value register.

27. The method of claim 25 further comprising setting a particular one of the bits in the register to valid when writing to the corresponding one of memory locations.

28. The method of claim 26 further comprising controlling first and second gates by the bits in the register, the first gate controlling an output of the random access memory and the second gate controlling an output of the reset value register.

29. The method of claim 11 wherein the memory locations are not reset upon resetting the bits in the register in response to a reset signal.

* * * * *